(12) United States Patent
Jiles

(10) Patent No.: US 8,378,690 B1
(45) Date of Patent: Feb. 19, 2013

(54) TEST CABLE DEVICE FOR DETECTING AN ELECTRICAL FAULT

(76) Inventor: Dave Jiles, Plain Field, NJ (US)

( * ) Notice: Subject to any disclaimer, the term of this patent is extended or adjusted under 35 U.S.C. 154(b) by 442 days.

(21) Appl. No.: 12/708,427

(22) Filed: Feb. 18, 2010

(51) Int. Cl.
*G01R 31/00* (2006.01)

(52) U.S. Cl. ............... 324/504; 340/425.5; 340/431

(58) Field of Classification Search .............. 324/504
See application file for complete search history.

(56) References Cited

U.S. PATENT DOCUMENTS

| | | | |
|---|---|---|---|
| 4,166,242 A * | 8/1979 | Spiteri ................ 324/504 |
| 4,368,455 A | 1/1983 | Menard |
| D304,928 S | 12/1989 | Mize |
| 5,416,421 A | 5/1995 | Doland, Sr. et al. |
| 6,043,661 A * | 3/2000 | Gutierrez ............ 324/504 |
| 6,054,779 A | 4/2000 | Zubko |
| 6,172,508 B1 | 1/2001 | Nutt |
| D485,196 S | 1/2004 | Zimmerman |
| 7,345,579 B2 * | 3/2008 | Nelson et al. ............. 340/431 |
| 2003/0080856 A1 * | 5/2003 | Sparacino et al. ......... 340/425.5 |
| 2007/0080691 A1 * | 4/2007 | Robinson, II ............. 324/426 |
| 2008/0231285 A1 * | 9/2008 | Curtis ................ 324/504 |
| 2008/0265904 A1 * | 10/2008 | Biel ................ 324/504 |
| 2009/0212784 A1 * | 8/2009 | Kilian et al. ............. 324/504 |

* cited by examiner

*Primary Examiner* — Melissa Koval
*Assistant Examiner* — Benjamin M Baldridge

(57) ABSTRACT

A test cable device comprising a main cable with a standard trailer connector; at least seven inner wires in the main cable, the first ends of each inner wire extending from the first end of the main cable, the first inner wire being a ground wire; a first clamp operatively connected to the first end of the first inner wire; and a second clamp operatively connected to each of the first ends of the second, third, fourth, and fifth inner wires; wherein the first ends of the sixth and seventh inner wires are operatively connected to a first flasher relay, the first flasher relay can be operatively connected to a port of a relay unit; wherein the device can be operatively connected to a power source via the first and second clamp, power is directed through the device and to the trailer via the trailer connector.

7 Claims, 4 Drawing Sheets

TEST CABLE DEVICE FOR DETECTING AN ELECTRICAL FAULT

FIELD OF THE INVENTION

The present invention is directed to electrical cables, more particularly to a test cable device for detecting an electrical fault in a trailer.

BACKGROUND OF THE INVENTION

It may be necessary to test the electrical system of a vehicle-towed trailer, for example so that any non-functioning lights can be replaced. To accomplish the testing, the tow vehicle is usually connected to the trailer. For example, to test the functionality of the brake tights of the trailer, the brake pedal located within the tow vehicle must first be depressed. Therefore, the overall lighting system of a trailer cannot be reliably tested unless a tow vehicle is on hand and the vehicle is connected to the trailer. The present invention features a test cable device for testing the functionality of a trailer electrical system (e.g., for detecting an electrical fault in a trailer). The test cable device does not require that a tow vehicle be used in combination with the trailer.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DESCRIPTION OF PREFERRED EMBODIMENTS

Figure 1:
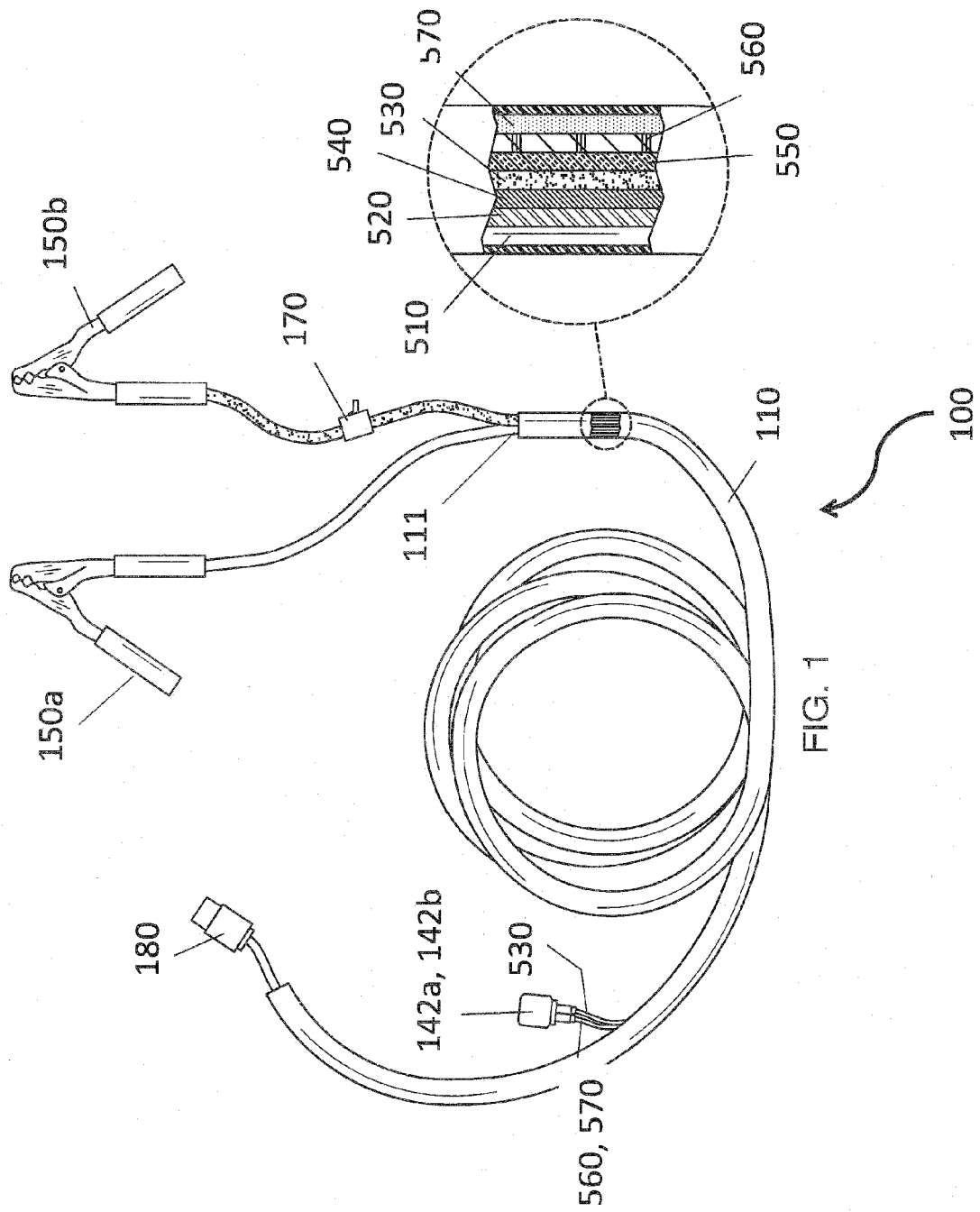
FIG. 1 is a perspective view of the test cable device of the present invention.

Referring now to FIGS. 1-4, the present invention features a test cable device 100 for helping a user (e.g., technician) detect an electrical fault in a trailer. The test cable device 100 comprises a main cable 110 with a plurality of inner wires. The main cable 110 may be a seven-way wire (e.g., the main cable 110 has seven inner wires). Seven-way wires are well known to one of ordinary skill in the art. For example, seven-way wires are often used for trailer connections. As shown in FIG. 1, in some embodiments, the main cable 110 (e.g., seven-way wire) has a first wire 510 (e.g., white wire), which is the ground wire. In some embodiments, the seven-way wire has a second wire 520 (e.g., blue wire), which connects to the electric brake. In some embodiments, the seven-way wire has a third wire 530 (e.g., red wire), a fourth wire 540 (e.g., brown wire), a fifth wire 550 (e.g., black wire), a sixth wire 560 (e.g., green wire), and/or a seventh wire 570 (e.g., yellow wire).

Figure 2:
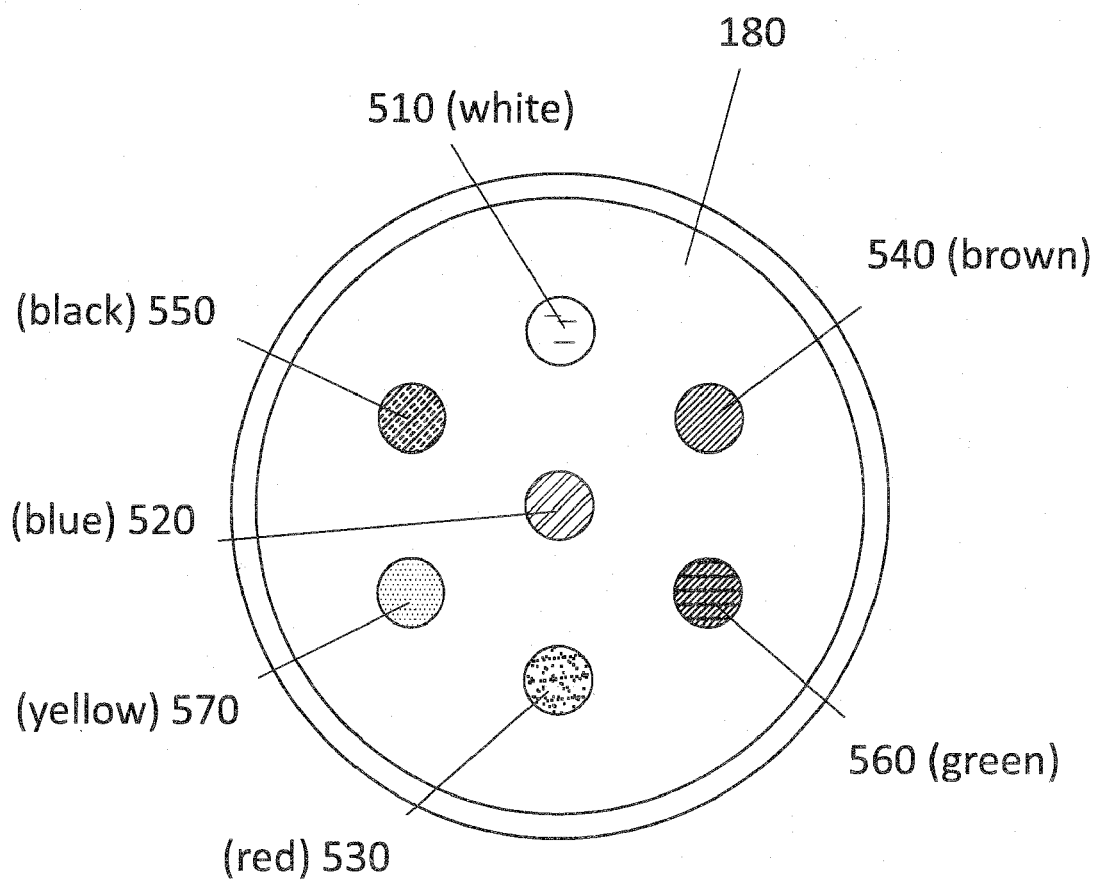
FIG. 2 is a front view of the trailer connector of the test cable device of the present invention.

The main cable 110 has a first end 111 and a second end. Disposed on the second end is a trailer connector 180. Trailer connectors are well known to one of ordinary skill in the art. The trailer connector 180 is for connecting the cable 110 (and the inner wires) to the trailer. FIG. 2 shows the second ends of the inner wires of the cable 110 in the trailer connector 180.

In some embodiments, the first ends of the inner wires in the main cable 110 extend out of the first end 111 of the main cable 110.

The first end of the first wire 510 (e.g., ground wire) is operatively connected to a first clamp 150a (e.g., black clamp). In some embodiments, the first end of a second wire 520 (e.g., a blue wire) is operatively connected to a second clamp 150b (e.g., red clamp, positive clamp). In some embodiments, the first end of a third wire 530 (e.g., red) is operatively connected to the second clamp 150b. In some embodiments, the first end of a fourth wire 540 (e.g., brown) is operatively connected to the second clamp 150b. In some embodiments, the first end of a fifth wire 550 (e.g., black) is operatively connected to the second clamp 150b.

In some embodiments, the test cable device 100 of the present invention comprises an on/off switch 170. The on/off switch 170 may be operatively connected to the second wire 520 and/or third wire 530 and/or fourth wire 540 and/or the fifth wire 550. As shown in FIG. 1, the on/off switch 170 is disposed in between the first end 111 of the main cable 110 and the second clamp 150b. The on/off switch 170 functions to allow or prevent current from flowing (e.g., from a battery 190 to the trailer connector 180). The on/off switch 170 may help eliminate sparks when connecting and disconnecting the power source (e.g., battery 190). Or, the on/off switch 170 may help prevent the power source (e.g., battery 190) from draining when repairs are being made to the system.

The first end of a sixth wire 560 (e.g., green) and the first end of a seventh wire 570 (e.g., yellow) are both operatively connected to a first end 142a of a flasher relay. The first end 142a of the flasher relay can be operatively connected (e.g., plugged into) a first port of a relay unit. Flasher relays and relay units are well known to one of ordinary skill in the art.

In some embodiments, the device 100 further comprises an eighth wire (e.g., green or yellow) and a ninth wire (e.g., green or yellow). The first ends of the eighth and ninth wires are both operatively connected to a second end 142b of the flasher relay. The second end 142b of the flasher relay can be operatively connected to the second port of the relay unit. The second ends of the eighth and ninth wires may be operatively connected to the second wire (e.g., blue wire) and/or the third wire (e.g., red wire), for example for power (e.g., because the second and third wires are connected to the second clamp 150b, which becomes connected to a power source).

In some embodiments, the yellow wire is spliced into the green wire, the green wire being connected to a flasher relay. A red wire may be connected to an end of the flasher relay and connected to all the other wires (except the ground wire). The flasher relay is controlled by the on/off switch.

Figure 3:
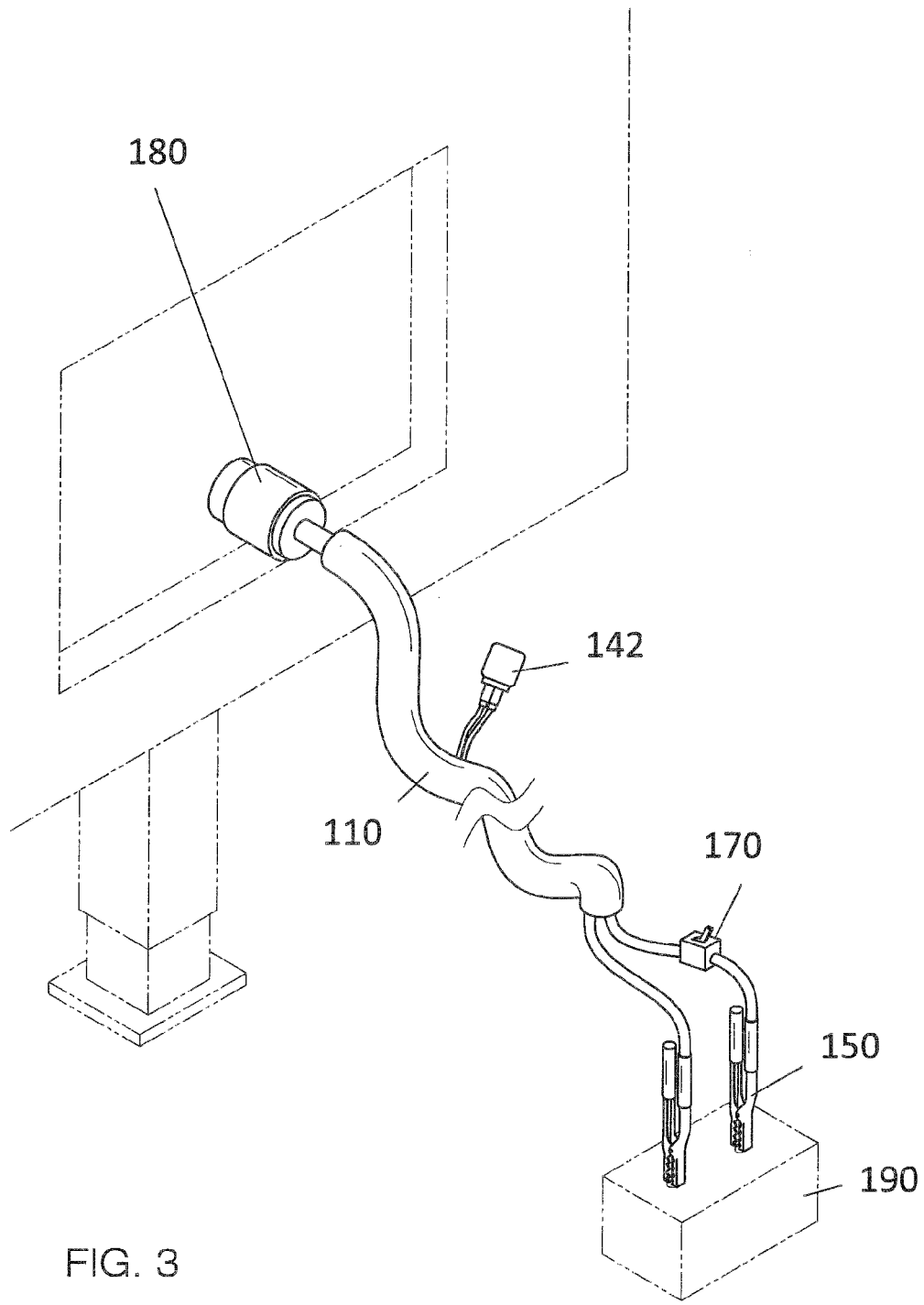
FIG. 3 is an in-use view of the test cable device of FIG. 1.

As shown in FIG. 3, the device 100 is operatively connected to a power source 190 (e.g., a battery, a 12 volt DC power source) via the first clamp 150a and the second clamp 150b. Power is directed through the device 100 of the present invention and to the electrical components (e.g., lights) in the trailer.

In some embodiments, some or all of the wires in the cable 110 are sealed together.

Figure 4:
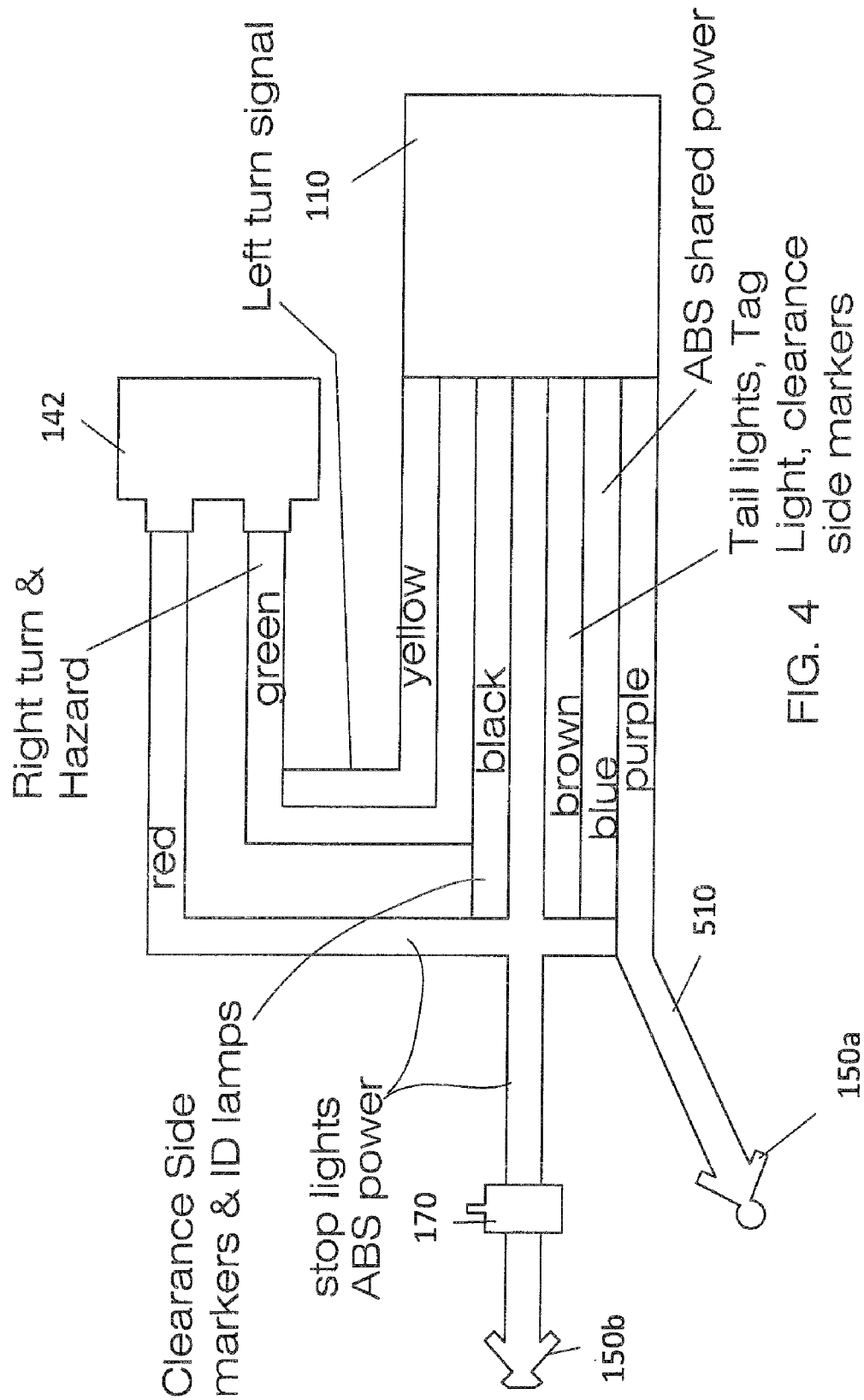
FIG. 4 is a schematic representation of the electrical components of the present invention.

Referring now to FIG. 4, in some embodiments, the black wire functions to test clearance side markers and/or lamps. In some embodiments, the brown wire functions to test tail lights, tag lights, clearance side markers, etc. In some embodiments the blue wire functions to test ABS shared power. In some embodiments, the red wire functions to test stop lights and/or ABS power. In some embodiments, the green wire functions to test the right turn signal and hazard lights. In some embodiments, the yellow wire functions to test the left turn signal and hazard lights.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

What is claimed is:

1. A test cable device comprising:
   (a) a main cable having a first end and a second end;
   (b) a standard trailer connector disposed on the second end of the main cable;
   (c) a first inner wire, a second inner wire, a third inner wire, a fourth inner wire, a fifth inner wire, a sixth inner wire, and a seventh inner wire, each inner wire disposed in the main cable, each inner wire having a first end and a second end, the first ends of each inner wire extending from the first end of the main cable, the first inner wire being a ground wire;
   (d) a first clamp operatively connected to the first end of the first inner wire; and
   (e) a second clamp operatively connected to each of the first end of the second inner wire, the first end of the third inner wire, the first end of the fourth inner wire, and the first end of the fifth inner wire;

wherein the first end of the sixth inner wire and the first end of the seventh inner wire are both operatively connected to a first flasher relay end, wherein the first flasher relay end can be operatively connected to a first port of a relay unit;

wherein the device can be operatively connected to a power source via the first clamp and the second clamp, wherein power is directed through the device and to the trailer via the trailer connector.

2. The test cable device of claim 1 further comprising an eighth wire and a ninth wire, wherein first ends of both the eighth wire and the ninth wire are operatively connected to a second flasher relay end.

3. The test cable device of claim 2, wherein the second flasher relay end can be operatively connected to a second port of the relay unit.

4. The test cable device of claim 2, wherein second ends of the eighth wire and the ninth wire are operatively connected to the second wire and/or the third wire.

5. The test cable device of claim 1, wherein the power source is a battery.

6. The test cable device of claim 1, wherein some or all of the inner wires in the main cable are sealed together.

7. The test cable device of claim 1 further comprising an on/off switch.

\* \* \* \* \*